United States Patent
Chu et al.

(10) Patent No.: US 7,109,710 B2
(45) Date of Patent: Sep. 19, 2006

(54) METHOD AND APPARATUS TO IMPROVE SIGNAL-TO-NOISE RATIO WITHOUT COMPROMISING FIELD-OF-VIEW FOR SIMULTANEOUS MR DATA ACQUISITION BY AN ARRAY OF RF COILS OF AN MR SCANNER

(75) Inventors: Dashen Chu, Hartland, WI (US); Recardo Matias, Brookfield, WI (US); Travis Monke, Shorewood, WI (US); Phillip E. Steen, Delafield, WI (US); Fraser J. L. Robb, Aurora, OH (US)

(73) Assignee: General Electric Company, Schenectady, NY (US)

( * ) Notice: Subject to any disclaimer, the term of this patent is extended or adjusted under 35 U.S.C. 154(b) by 64 days.

(21) Appl. No.: 10/756,592

(22) Filed: Jan. 13, 2004

(65) Prior Publication Data
US 2005/0083055 A1    Apr. 21, 2005

Related U.S. Application Data

(60) Provisional application No. 60/512,476, filed on Oct. 17, 2003.

(51) Int. Cl.
*G01V 3/00*    (2006.01)

(52) U.S. Cl. ........................ 324/309; 324/318; 324/322

(58) Field of Classification Search ................ 324/307, 324/309, 318; 600/422
See application file for complete search history.

(56) References Cited

U.S. PATENT DOCUMENTS

| | | | | |
|---|---|---|---|---|
| 4,825,162 A | | 4/1989 | Roemer et al. | |
| 5,179,332 A | * | 1/1993 | Kang | 324/313 |
| 5,221,900 A | * | 6/1993 | Larson, III | 324/307 |
| 5,272,437 A | * | 12/1993 | Wardenier | 324/322 |
| 5,374,890 A | * | 12/1994 | Zou et al. | 324/318 |
| 5,389,880 A | * | 2/1995 | Mori | 324/318 |
| 5,457,386 A | * | 10/1995 | Matsunaga et al. | 324/318 |
| 5,548,218 A | * | 8/1996 | Lu | 324/318 |
| 5,910,728 A | * | 6/1999 | Sodickson | 324/309 |
| 5,951,474 A | * | 9/1999 | Matsunaga et al. | 600/422 |
| 6,253,101 B1 | | 6/2001 | Seng et al. | |
| 6,323,648 B1 | | 11/2001 | Belt et al. | |
| 6,396,266 B1 | | 5/2002 | Debbins et al. | |
| 6,493,572 B1 | * | 12/2002 | Su et al. | 600/422 |
| 6,597,173 B1 | | 7/2003 | Bernstein | |

(Continued)

OTHER PUBLICATIONS

Chen, C.-N. et al., "Quadrature Detection Coils—A Further Improvement in Sensitivity", Journal of Magnetic Resonance, 1983, vol. 54, pp. 324-327.

*Primary Examiner*—Brij Shrivastav
*Assistant Examiner*—Dixomara Vargas
(74) *Attorney, Agent, or Firm*—Ziolkowski Patent Solutions Group, SC; Michael A. Della Penna; Carl B. Horton (57) ABSTRACT

A method and apparatus is disclosed to analogically combine MR signals from RF coils to form multiple sets of analogically combined MR signals, and then digitally combine the analogically combined sets of MR signals to provide a digitized signal set for image reconstruction. The analogical combining followed by the digital combining of acquired MR signals improves intrinsic SNR of the RF coils used for data acquisition from a field-of-view (FOV) without compromising FOV for simultaneous MR data acquisition.

20 Claims, 5 Drawing Sheets

U.S. PATENT DOCUMENTS

| | | | |
|---|---|---|---|
| 6,677,755 B1 * | 1/2004 | Belt et al. | 324/322 |
| 6,768,302 B1 * | 7/2004 | Vester | 324/307 |
| 6,798,202 B1 * | 9/2004 | Savelainen | 324/318 |
| 6,870,368 B1 * | 3/2005 | Visser et al. | 324/318 |
| 6,914,432 B1 * | 7/2005 | Dumoulin et al. | 324/318 |
| 2004/0257079 A1 * | 12/2004 | Dumoulin et al. | 324/318 |

* cited by examiner

METHOD AND APPARATUS TO IMPROVE SIGNAL-TO-NOISE RATIO WITHOUT COMPROMISING FIELD-OF-VIEW FOR SIMULTANEOUS MR DATA ACQUISITION BY AN ARRAY OF RF COILS OF AN MR SCANNER

CROSS REFERENCE TO RELATED APPLICATION

The present invention claims the benefit of U.S. Ser. No. 60/512,476 filed Oct. 17, 2003.

BACKGROUND OF THE INVENTION

The present invention relates generally to magnetic resonance (MR) imaging and, more particularly, to a method and apparatus for multi-stage processing of channels of acquired MR signals to improve signal-to-noise ratio (SNR) without compromising field-of-view (FOV) for simultaneous data acquisition from an array of RF coils.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

For localized high-resolution MR imaging applications, an array of surface RF coils are typically used because a smaller or more localized RF coil has a higher B1 field and less loading-induced noise, which yields a higher intrinsic signal-to-noise ratio (SNR) for the receiver or coil. Generally, the following expression:

$$SNR \approx \frac{V\omega^2 B1}{\sqrt{4kT\Delta f R}} \qquad \text{(Eqn. 1)};$$

where V is the sample volume, $\Delta f$ is the receiver bandwidth, R is the total noise, may be used to define or quantify the SNR associated with a particular RF coil or receiver of an RF receiver coil array or system. As one skilled in the art will appreciate, as SNR decreases, the diagnostic value of the final reconstructed image also decreases. That is, as SNR decreases, resolution of the final reconstructed image decreases.

Current signal processing techniques support the combination of signals from individual coils or receivers into combo- or super-coils. This combination of coils effectively allows signals to be received from a desired FOV or area that is larger than that individually supported by a particular coil. The optimal area or volume supported by a particular coil depends, in large part, on the size of the coil. For instance, coil sensitivity decreases with increasing coil size. On the other hand, reducing coil size increases the total number of coils needed to receive signals from the desired FOV.

For any given application, there is an optimized coil size. To this end, using an oversized coil alone will result in intrinsic and undesirable SNR penalty. Quadrature analog combination is a signal processing technique that has been developed to address this SNR penalty associated with oversized coils, but with some limitations. Quadrature analog combination can provide $\sqrt{2}$ times higher SNR where the B1 field from each coil are orthogonal to each other. The B1 field between two quadrature coils, however, is not always orthogonal and, as such, the direction of B1 field between the coils may vary from place to place. Thus, the combined SNR can be worse than the respective SNR of the individual coils. This worsening of SNR may be attributed to phase cancellation. In this regard, the combined SNR does not yield consistent SNR improvement over the entire FOV. Furthermore, larger sized coils present more isolation problems between coil elements from the stronger inductive coupling therebetween which will inherently degrade the combined SNR. Therefore, the benefit of using a large quadrature pair of coils with quadrature analog combining to improve SNR over a large FOV is limited.

In contrast to analog combination, due to the fact that digital combination only combines the magnitude of each signal regardless of the phase between the received signals, the digital combination of signals received by independent receivers can be used to provide net gain of SNR instead of worsening of SNR over the desired and enlarged FOV. Accordingly, RF coils could be designed such that each coil element has an optimized size for B1 field penetration and utilize the MR system independent receivers to yield the desired FOV, provided that there are enough number of MR system independent receivers.

However, MR scanners are subject to a limited number of receivers and, as such, a tradeoff of designing coils having desirable FOV and designing coils having optimized SNR must be made.

It would, therefore, be desirable to have a method capable of combining MR signals received from an array of receiver coils so as to realize optimized SNR without compromising FOV for simultaneous MR data acquisition by the array.

BRIEF DESCRIPTION OF THE INVENTION

The present invention is directed to a method and apparatus that utilizes both analog and digital combinations per spatial relationship between coil elements to overcome the limitations presented by a limited number of receivers to realize optimized SNR without compromising FOV for simultaneous data acquisition.

The present invention is directed to a signal processing technique that involves the analogical combination of MR signals from non-adjacent RF coils to forms multiple sets of analogically combined MR signals. The sets of analogically combined MR signals are then digitally combined to provide a single signal set for image reconstruction. In this regard, a method is disclosed that utilizes analog combiners and digital combiners to effectuate signal processing. The analogical combining followed by the digital combining of acquired MR signals improves intrinsic SNR of the RF coils without compromising FOV for simultaneous MR data acquisition. Hence, faster MR imaging may be achieved.

Therefore, in accordance with one aspect of the present invention, a method of MR imaging is provided. The method includes the steps of acquiring multiple channels and MR signals from a field-of-view and combining the multiple channels of MR signals into at least two sets of MR signals. The method further includes the step of combining the at least two sets of MR signals into one set of MR signals for image reconstruction of the FOV.

According to another aspect of the present invention, an MR signal receiver assembly is provided that includes N receiver elements configured to acquire N sets of MR signals. The signal receiver assembly further includes less than N analog combiners configured to analogically combine the N sets of MR signals into M sets of MR signals wherein M less than N. The signal receiver assembly further includes less than N digital combiners configured to digitally combine the M sets of MR signals into at least one digitally combined set of MR signals for image reconstruction.

In accordance with yet a further aspect of the present invention, a computer readable storage medium having a computer program stored thereon is provided and represents a set of instructions that when executed by a computer causes the computer to acquire multiple channels of MR signals. The computer is also caused to analogically combine the multiple channels of MR signals into at least two sets of analogically combined MR signals and digitally combine the at least two sets of analogically combined MR signals into at least one set of digitally combined MR signals.

According to yet another aspect of the present invention, an MR imaging apparatus is provided. The apparatus includes means for acquiring multiple channels of MR signals as well as a means for analogically combining the multiple channels of MR signals into at least one pair of MR signal sets. The imaging apparatus further includes a means for digitally combining the at least one pair of MR signal sets into a single digital MR signals set.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
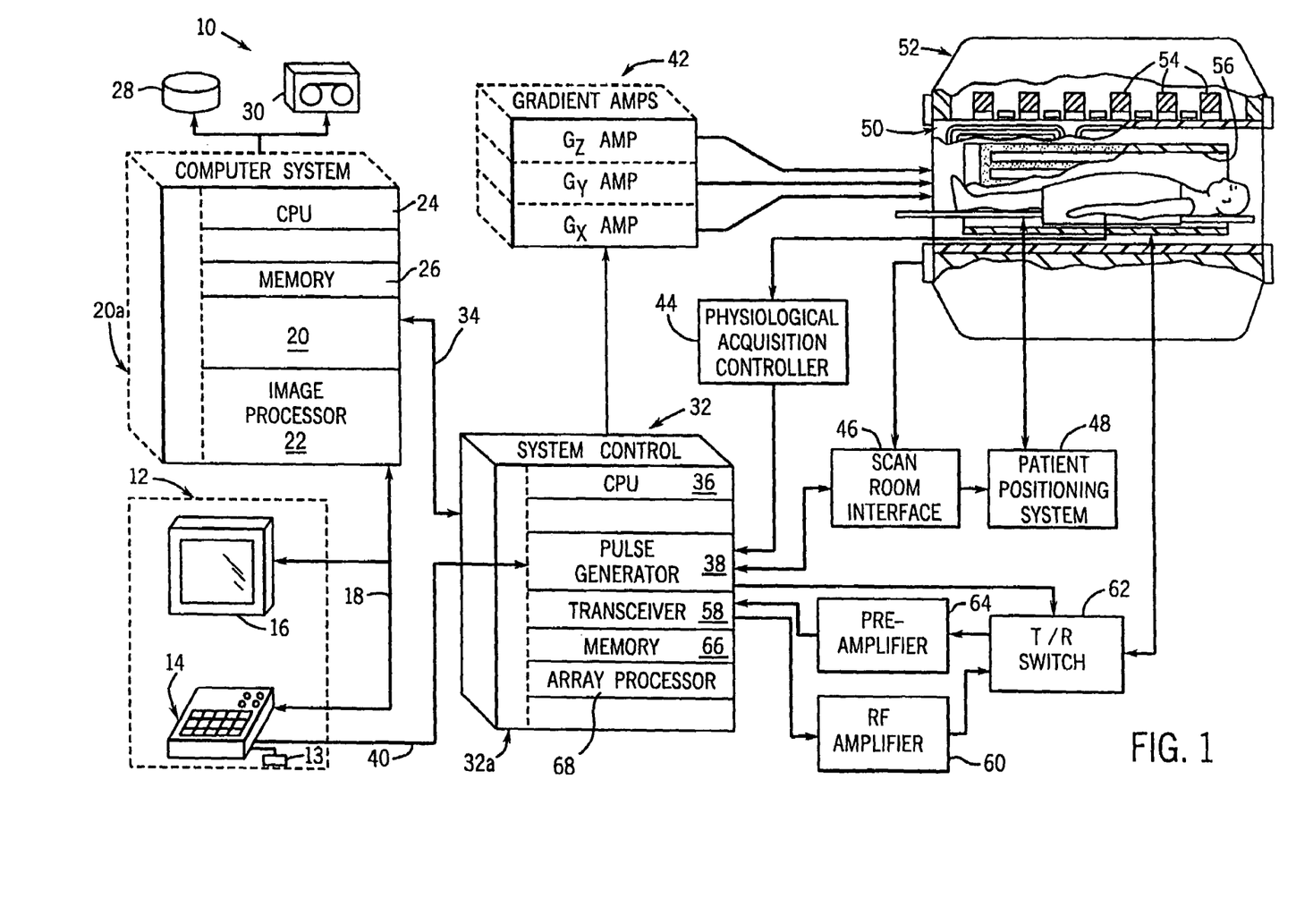
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a signal processing technique that exploits phased array imaging technologies. For illustration purposes, the invention will be described with respect to a 4-coil planar phased array such as that shown in FIG. 2. One skilled in the art will appreciate that the present invention is equivalently applicable with coil arrays having less or more than four coils. For illustration purposes, it is assumed that each coil has a size defined by a diameter, d, which is optimized for B1 field penetration in a region-of-interest (ROI). It is assumed that four coil elements are needed to cover the desired FOV. Additionally, only the voxels in the optimized ROI, i.e., within the distance d above the coils in the array, are of interest.

Figure 2:
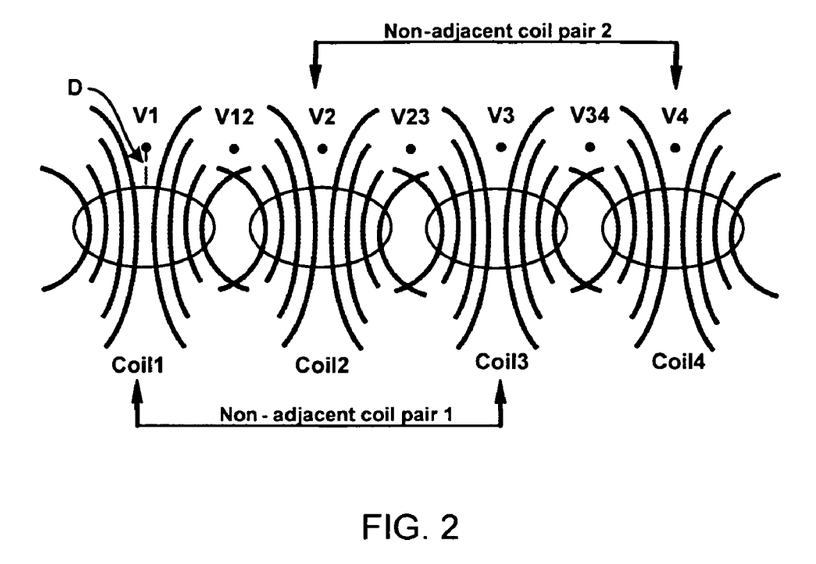
FIG. 2 is a schematic representation of a 4-coil phased coil array and the individual B1 field associated with each coil to acquire data from voxels of an FOV.

In general and continuing with the exemplary illustration, all four coils will receive or detect signal from any given voxel. Thus, the combined signal can be represented by:

$$\vec{B}1_{comb} = \vec{B}1_{coil1} + \vec{B}1_{coil2} + \vec{B}1_{coil3} + \vec{B}1_{coil4} \qquad \text{Eqn. (2);}$$

where $\vec{B}1$ corresponds to the detected MR signal received by a respective coil.

Figure 3:
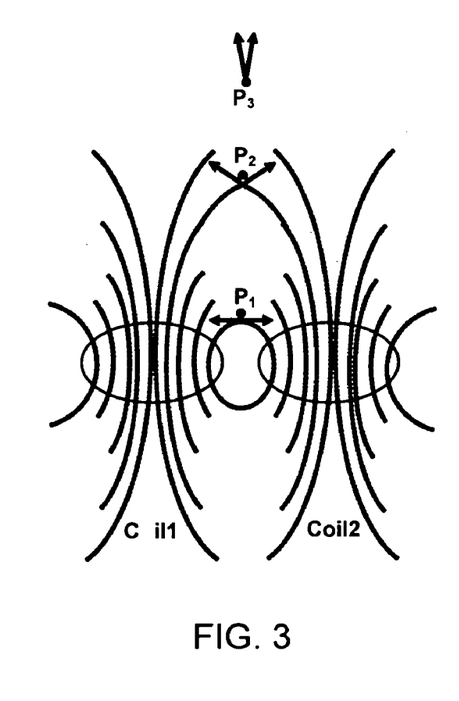
FIG. 3 is a schematic representation of two coils of the phased coil array of FIG. 2 illustrating the variation in angle between any two B1 fields.

Referring now to FIG. 3, due to the vector nature of the B1 fields, the angle between any two B1 fields varies from place to place. To effectively combine the B1 fields, the angles need to be spatially compensated for by the system phase shift or be eliminated from the addition. In practice, MR systems typically simply add the B1 field magnitude from each independent receiver or coil using a standard sum-of-squares reconstruction. This reconstruction method eliminates the phase from the addition and achieves the desired combination gain. Conventionally, N independent receivers are used to accommodate N coil elements. Thus, in this example, four independent receivers are used in order to accommodate four coil elements.

Further to the above-illustrated example, it is important to describe in detail how each coil element receives signal from a given voxel as well as the B1 field contribution of each coil to the combined signal or signal set used to reconstruct the final composite image. From the coil elements point of view, there are two types of voxels: the voxels located above the geometric center of each coil, such as voxels V1, V2, V3, and V4, and the voxels located in the common area between adjacent coils, labeled as V12, V23, and V34 in FIG. 2.

Figure 4:
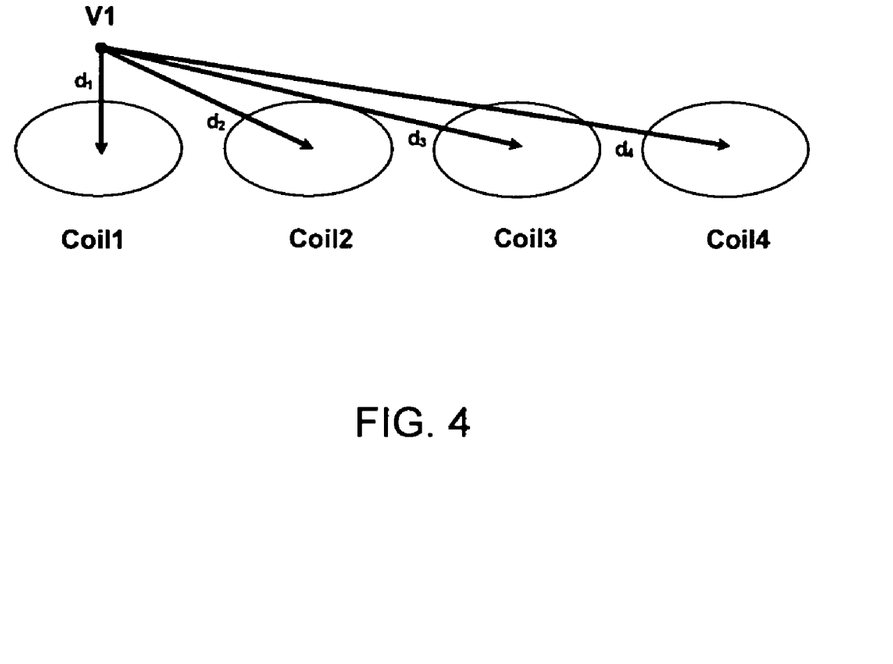
FIG. 4 is a schematic representation of the phased coil array of FIG. 2 illustrating signal reception by each coil from a voxel position in the FOV.

As shown in FIG. 4, for the signal from voxel V1, the coil nearest to this voxel, coil1, picks up or detects the most signal. In other words, the B1 field of coil1 has the most contribution to the combined signal. The contributions from adjacent neighboring coils are much smaller ($d_2 > d_1$), since the B1 field is inversely proportional to the distance (coil-voxel) squared as defined by: $B1 \approx \mu_0 I/4\pi d^2$. Moreover, the contributions from secondary neighboring coils are virtually negligible ($d_3, d_4 >> d_1$), normally around −18 dB or less than the nearest coil (coil1 for voxel V1) in terms of B1 sensitivity. As illustrated in FIG. 4, each coil (coil1, coil2, coil3, coil4) detects signal from voxel V1. It should be noted, however, that generally the most significant impact in terms of the combined signal comes from the nearest coil (coil1) and the adjacent coil (coil2) only. Given that signal from voxel V1 is predominantly detected by coils 1 and 2, Eqn. (2) can be approximately simplified as:

$$\vec{B}1_{comb} = \vec{B}1_{coil1} + \vec{B}1_{coil2} \qquad \text{Eqn. (3).}$$

Figure 5:
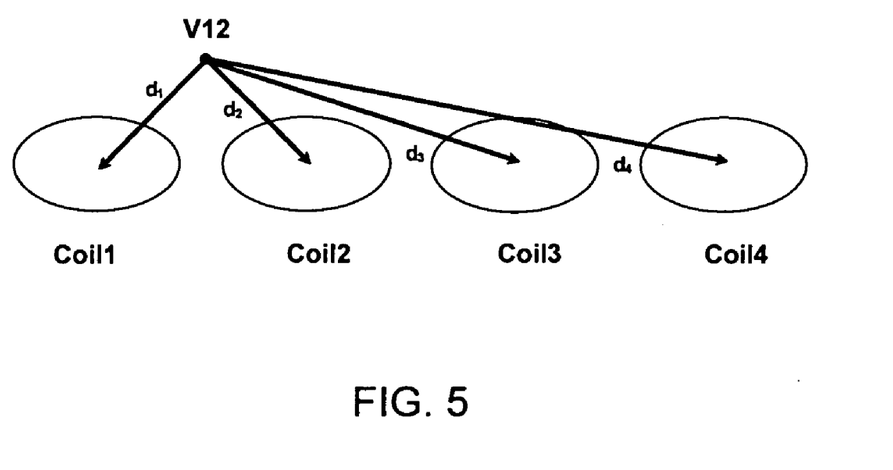
FIG. 5 is a schematic representation of the phased coil array of FIG. 2 illustrating respective signal reception from a voxel position spatially between two coils of the coil array.

Referring now to FIG. 5, for the signals from voxel V12, which is spatially located in the common area between adjacent coils (coil1 and coil2), the dominant B1 contributions are from coil1 and coil2, since $d_1 \cong d_2$. While the contributions from secondary neighboring coils (coil3 and coil4) are still present, these contributions on the composite image are virtually negligible due in large part to the spatial distance of coil3 and coil4 relative to coil1 and coil2, e.g. $d_3, d_4 >> d_1, d_2$. Thus the combined signal can be expressed as in Eqn. (3) for voxels V1 and V12. The B1 contributions from coil3 and coil4 in the combined signal are only meaningful to voxels V3, V4, V23, and V34 located near coil3 and coil4 as indicated in FIG. 1. Similarly, for voxels V3, V4, and V34, the combined B1 field can be simplified as:

$$\vec{B}1_{comb} = \vec{B}1_{coil3} + \vec{B}1_{coil4} \qquad \text{Eqn. (4).}$$

For voxels in the common area between coil2 and coil3, the combined B1 field can be simplified as:

$$\vec{B}1_{comb} = \vec{B}1_{coil2} + \vec{B}1_{coil3} \qquad \text{Eqn. (5).}$$

For voxels spatially above coil2, the combined B1 field can be simplified as:

$$\vec{B}1_{comb} = \vec{B}1_{coil1} + \vec{B}1_{coil2} + \vec{B}_{coil3} \qquad \text{Eqn. (6).}$$

Similarly, for voxels spatially above coil3, the combined B1 field can be simplified as:

$$\vec{B}1_{comb} = \vec{B}1_{coil2} + \vec{B}1_{coil3} + \vec{B}_{coil4} \qquad \text{Eqn. (7).}$$

From the above description, it is clear that even though each coil contributes to the composite (combined) signal, for any given local voxel only the corresponding adjacent coils make meaningful B1 field contribution to the combined signal for a planar PA coil. The secondary adjacent coils and any further adjacent coils are primarily used to increase the FOV.

It therefore follows that the signals received from the secondary adjacent coils have little impact on each other in terms of addition of B1 field for any given local voxel, as set forth in Eqns. 6–7. As such, the secondary adjacent coils can be analogically combined without resulting in combined signal degradation. In general, the combined noise is given by the following expression:

$$R = \sum_{i,k}^{N} R_{ik} \qquad \text{Eqn. (8);}$$

and $$R_{ik} \equiv \sigma \int\int\int E_i E_k \, dV \qquad \text{Eqn. (9);}$$

where $E_i$ is the electric field induced in the sample by the current in $coil_i$, $E_k$ is the electric field induced in the sample by the current in $coil_k$, and a is the conductivity of the sample. Considering that the electric field is proportional to $E \propto 1/d^3$, and that $coil_i$ and $coil_k$ are the non-adjacent coils, the mutual electric coupling term $E_i E_k$ (i≠k) is much less than term $E_i E_k$ (i=k). Thus the correlated noise ($R_{ik} \equiv \sigma \int\int E_i E_k \, dV$) is virtually negligible between non-adjacent coils, i.e., $R_{ik}=0$ if i≠k.

Continuing with the above 4-coil example, the combined noise matrix of coil1 and coil3 can be approximated as $$\begin{bmatrix} R11 & 0 \\ 0 & R33 \end{bmatrix}, R13 = R31 = 0 \qquad \text{Eqn. (10).}$$

Since the noise matrix is diagonal for non-adjacent coils, the combination scheme yields no different combined noise; therefore, analog combination may be considered equivalent to digital combination in terms of combined noise. That is, digital combination between non-adjacent coils is approximately equivalent to analogical combination in terms of SNR.

Figure 6:
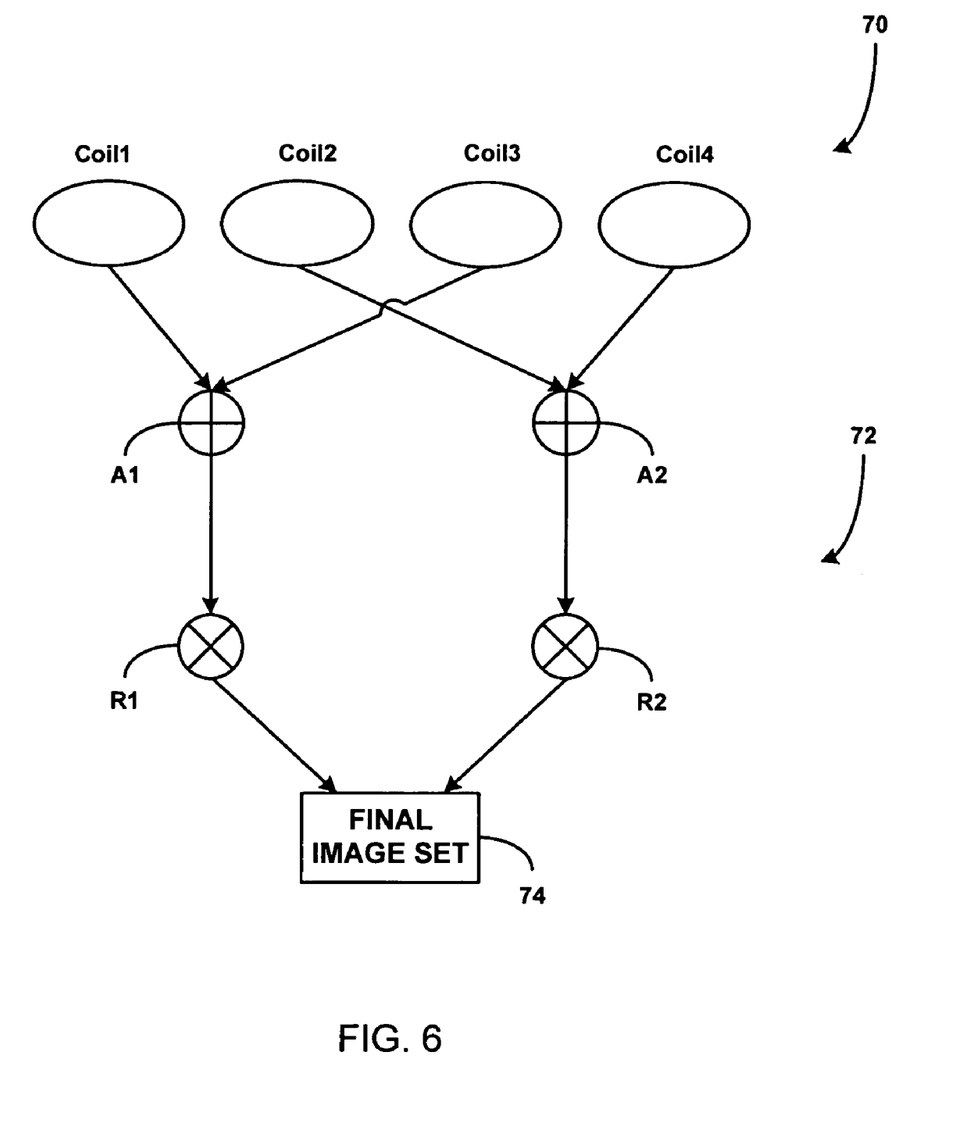
FIG. 6 is a schematic representation of the phased coil array of FIG. 2 together with a signal processing unit in accordance with the present invention.

Referring now to FIG. 6, a phased array of receiver coils 70, that in the example includes four independent coils configured to acquire four channels of MR signals, is designed to detect the signals from excited nuclei in an ROI. The coil array 70 is connected to a signal processing unit 72. The signal processing unit includes a linear analog combiner A1 connected to receive MR signals from non-adjacent coils, e.g. coil1 and coil3, and combine the signal from these secondary neighboring coils to form analogically combined set of MR signals, Pair1. The combined B1 field of Pair1 may be defined as follows:

$$\vec{B}1_{Pair1} = \vec{B}1_{coil1} + \vec{B}1_{coil3} \qquad \text{Eqn. (11).}$$

Similarly, another linear analog combiner A2 is used to combine the MR signals from the coil pair of coil2 and coil4. The signals from these secondary neighboring coils are analogically combined to form another pair or signal set, Pair2. The combined B1 field for Pair2 may be defined as follows:

$$\vec{B}1_{Pair2} = \vec{B}1_{coil2} + \vec{B}1_{coil4} \qquad \text{Eqn. (12).}$$

Two system receivers R1 and R2, are connected to analog combiners A1 and A2 and are designed to digitally combine the signals from the two pairs of analogically combined coils (Pair1 and Pair2) to form a final composite signal set that is used to generate a final image 74 in accordance with known reconstruction techniques. The final combined B1 field may be defined as:

$$\vec{B}1_{comb} = \vec{B}1_{Pair1} + \vec{B}1_{Pair2} \qquad \text{Eqn. (13); or}$$

$$\vec{B}1_{comb} = \vec{B}1_{coil1} + \vec{B}1_{coil2} + \vec{B}1_{coil3} + \vec{B}1_{coil4} \qquad \text{Eqn. (14).}$$

The present invention is applicable with partial Fourier imaging and, as such, the reconstruction techniques may include homodyne processing.

Figure 7:
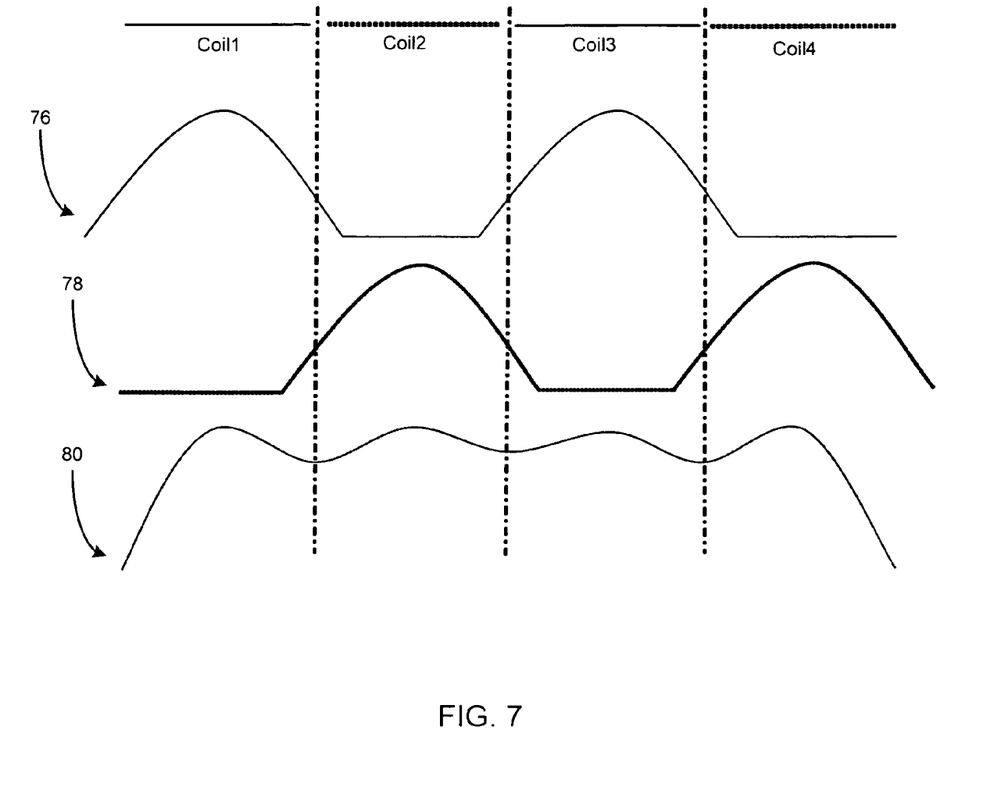
FIG. 7 illustrates the B1 field profiles realized in an exemplary embodiment of the present invention.

FIG. 7 illustrates the saggital B1 field profile of each analogically combined coil pair (Pair1 and Pair2) as well as the resulting B1 field after digital combination. Specifically, profile 76 corresponds to the profile of Pair1 (coil1 and coil3) whereas profile 78 corresponds to the profile of Pair2 (coil2 and coil4). The resulting B1 field after digital combination is reflected in profile 80.

It should be noted that the signals from Pair1 and Pair2 are spatially complementary to each other. As a result, once the two pairs are digitally combined, the digital combinations of B1 field in all three adjacent areas (the common areas between coil1 and coil2, coil2 and coil3, coil3 and coil4) are realized, as shown in FIG. 7. Accordingly, the combination of signals from the four coil array 70 is effectively achieved by uniquely employing two analog combiners, A1 and A2, in addition to two system receivers, R1 and R2. Thus, the SNR optimization of a coil array having N coils can be realized by using N/2 analog combiners and N/2 independent system receivers for digital combination. In other words, using N independent system receivers, signals from up to 2N coil elements can be combined without compromising SNR and FOV.

The RF coil assembly heretofore described may be dynamically configured such that the detection elements or coils thereof may be independently activated, or grouped, depending upon the particular imaging needs or clinical objectives of an imaging session. As such, the present invention includes a controller and/or computer responsive to a set of instructions and/or computer program that may dynamically activate/deactivate detection elements of the RF coil assembly to achieve the diagnostic imaging objectives of the imaging session.

Therefore, in accordance with one embodiment of the present invention, a method of MR imaging is provided. The method includes the steps of acquiring multiple channels and MR signals from an FOV and combining the multiple channels of MR signals into at least two sets of MR signals. The method further includes the step of combining the at least two sets of MR signals into one set of MR signals for image reconstruction of the FOV.

According to another embodiment of the present invention, an MR signal receiver assembly is provided that includes N receiver elements configured to acquire N sets of MR signals. The signal receiver assembly further includes less than N analog combiners configured to analogically combine the N sets of MR signals into M sets of MR signals, wherein M less than N. The signal receiver assembly further includes less than N digital combiners configured to digitally combine the M sets of MR signals into at least one digitally combined set of MR signals for image reconstruction.

In accordance with yet a further embodiment of the present invention, a computer readable storage medium having a computer program stored thereon is provided and represents a set of instructions that when executed by a computer causes the computer to acquire multiple channels of MR signals. The computer is also caused to analogically combine the multiple channels of MR signals into at least two sets of analogically combined MR signals and digitally combine the at least two sets of analogically combined MR signals into at least one set of digitally combined MR signals.

According to yet another embodiment of the present invention, an MR imaging apparatus is provided. The apparatus includes means for acquiring multiple channels of MR signals as well as a means for analogically combining the multiple channels of MR signals into at least one pair of MR signal sets. The imaging apparatus further includes a means for digitally combining the at least one pair of MR signal sets into a single digital MR signals set.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising the steps of:
   (A) acquiring multiple channels of MR signals from a field-of-view (FOV);
   (B) combining the multiple channels of MR signals into at least two sets of MR signals, wherein each set comprises MR signals from less than all the multiple channels; and
   (C) combining the at least two sets of MR signals into one set of MR signals for image reconstruction of the FOV.

2. The method of claim 1 wherein step (B) includes the step of analogically combining the multiple channels of MR signals into the at least two sets of MR signals.

3. The method of claim 1 wherein step (C) includes the step of digitally combining the at least two sets of MR signals into the one set of MR signals.

4. The method of claim 1 wherein the two sets of MR signals comprise MR signals acquired from non-adjacent receiver coil elements.

5. The method of claim 4 wherein the two sets of MR signals are spatially complementary to one another.

6. The method of claim 1 wherein step (A) includes the step of acquiring N channels of MR signals from N coil elements, and wherein the at least two sets of MR signals include N/2 sets of MR signals.

7. The method of claim 1 configured to improve intrinsic signal SNR of RF coils without compromising FOV for simultaneous acquisition data from the RF coils.

8. An MR signal receiver assembly comprising:
   N receiver elements configured to acquire N sets of MR signals;
   less than N analog combiners configured to analogically combine the N sets of MR signals into M sets of MR signals, wherein M<N; and
   less than N digital combiners configured to digitally combine the M sets of MR signals into at least one digitally combined set of MR signals for image reconstruction.

9. The assembly of claim 8 wherein the less than N analog combiners includes N/2 analog combiners, and wherein M=N/2.

10. The assembly of claim 9 wherein the less than N digital combiners includes N/2 digital combiners configured to combine the M sets of MR signals into a single set of MR signals.

11. The assembly of claim 8 wherein the N receiver elements include N receiver coils capable of detecting RE energy.

12. The assembly of claim 8 wherein the N receiver elements include N surface coils.

13. The assembly of claim 8 wherein each analog combiner is further configured to combine MR signals from non-adjacent receiver elements.

14. The assembly of claim 8 incorporated into an MR imaging apparatus.

15. A computer readable storage medium having a computer program stored thereon and representing a set of instructions that when executed by a computer causes the computer to:
   acquire multiple channels of MR signals;
   analogically combine the multiple channels of MR signals into at least two sets of analogically combined MR signals; and
   digitally combine the at least two sets of analogically combined MR signals into at least one set of digitally combined MR signals.

16. The computer readable storage medium of claim 15 wherein the set of instructions further causes the computer to analogically combine the multiple channels of MR signals such that each set comprises MR signals acquired from non-adjacent receiver coils.

17. The computer readable storage medium of claim 15 wherein the MR signals from the at least two sets of analogically combined MR signals are spatially complementary to one another.

18. The computer readable storage medium of claim 15 wherein the set of instructions further causes the computer to acquire N channels of MR signals, and the at least two sets of analogically combined MR signals include N/2 sets of MR signals.

19. The computer readable storage medium of claim 18 wherein the computer is further caused to acquire the N channels of MR signals from a phased array of receiver coils comprising N receiver coils.

20. An MR imaging apparatus comprising:
   means for acquiring multiple channels of MR signals;
   means for analogically combining the multiple channels of MR signals into at least one pair of MR signal sets; and
   means for digitally combining the at least one pair of MR signal sets into a single digital MR signals set.

* * * * *

UNITED STATES PATENT AND TRADEMARK OFFICE
CERTIFICATE OF CORRECTION

PATENT NO. : 7,109,710 B2 Page 1 of 1
APPLICATION NO. : 10/756592
DATED : September 19, 2006
INVENTOR(S) : Chu et al.

It is certified that error appears in the above-identified patent and that said Letters Patent is hereby corrected as shown below:

Col. 10, line 9, (Claim 11), delete "RE" and substitute therefore -- RF --.

Signed and Sealed this

Fifth Day of December, 2006

JON W. DUDAS
*Director of the United States Patent and Trademark Office*